(12) United States Patent
Asano

(10) Patent No.: US 8,722,535 B2
(45) Date of Patent: May 13, 2014

(54) PATTERN FORMING METHOD, MOLD AND DATA PROCESSING METHOD

(71) Applicant: Kabushiki Kaisha Toshiba, Tokyo (JP)

(72) Inventor: Masafumi Asano, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/780,034

(22) Filed: Feb. 28, 2013

(65) Prior Publication Data
US 2013/0323925 A1 Dec. 5, 2013

(30) Foreign Application Priority Data
Jun. 4, 2012 (JP) .................................. 2012-127101

(51) Int. Cl.
*H01L 21/44* (2006.01)
*H01L 21/768* (2006.01)

(52) U.S. Cl.
CPC .................................. *H01L 21/76801* (2013.01)
USPC ........ 438/666; 430/324; 430/287.1; 430/323; 438/696; 438/689; 257/758

(58) Field of Classification Search
CPC ................ H01L 21/00; H01L 21/0337; H01L 21/768014; H01L 21/0338; H01L 21/28; H01L 21/31144; H01L 21/32139; H01L 21/76802; H01L 21/44; H01L 21/469; H01L 21/4757; H01L 23/5329; H01L 23/53295
See application file for complete search history.

(56) References Cited

U.S. PATENT DOCUMENTS

| 7,378,738 | B2 * | 5/2008 | Brunner et al. | ................ 257/758 |
| 2004/0127001 | A1 * | 7/2004 | Colburn et al. | ................ 438/586 |
| 2008/0299774 | A1 | 12/2008 | Sandhu | |
| 2009/0011367 | A1 * | 1/2009 | Omatsu et al. | ............. 430/287.1 |
| 2010/0167214 | A1 * | 7/2010 | Yoon et al. | ..................... 430/323 |
| 2010/0330807 | A1 * | 12/2010 | Kobayashi | ..................... 438/689 |
| 2012/0058435 | A1 * | 3/2012 | Seino et al. | .................... 430/324 |

FOREIGN PATENT DOCUMENTS

| JP | 2009-234114 | 10/2009 |
| JP | 2011-77475 | 4/2011 |

OTHER PUBLICATIONS

Doerk et al., "Measurement of Placement Error Between Self-Assembled Polymer Patterns and Guiding Chemical Prepatterns," Proc. of SPIE (2012), 8323:P-1-P-7.
Bencher et al., "Directed Self-Assembly Defectivity Assessment (Part II)," Proc. of SPIE (2012), 8323:N-1-N-10.

* cited by examiner

*Primary Examiner* — Bac Au
*Assistant Examiner* — Sophia Nguyen
(74) *Attorney, Agent, or Firm* — Finnegan, Henderson, Farabow, Garrett & Dunner, L.L.P.

(57) ABSTRACT

According to one embodiment, a pattern forming method is disclosed. The method can include forming an insulating layer on a major surface of a substrate. The method can include forming first and second openings on the insulating layer. The first opening has a first length in a first direction along the major surface, and the second opening has a second length longer than the first length in the first direction. The method can include forming a first pattern in the first opening. The method can include forming a second pattern in the second opening. The method can include forming a self-assembled material film contacting the insulating layer, the first pattern and the second pattern. The method can include forming a third pattern with guidance of the second pattern. In addition, the method can include forming a fourth pattern contacting the first pattern based on the third pattern.

12 Claims, 12 Drawing Sheets

PATTERN FORMING METHOD, MOLD AND DATA PROCESSING METHOD

CROSS-REFERENCE TO RELATED APPLICATIONS

This application is based upon and claims the benefit of priority from the prior Japanese Patent Application No. 2012-127101, filed on Jun. 4, 2012; the entire contents of which are incorporated herein by reference.

FIELD

Embodiments described herein relate generally to a pattern formation method, a mold and a data processing method.

BACKGROUND

For forming patterns of semiconductor devices and the like, photolithography is used. Besides photolithography, methods such as nano-imprinting and DSA (Directed Self Assembly) method using micro-phase separation have also been considered.

In this kind of pattern forming method, a further improvement of positioning accuracy is desirable.

DETAILED DESCRIPTION

Figure 1:
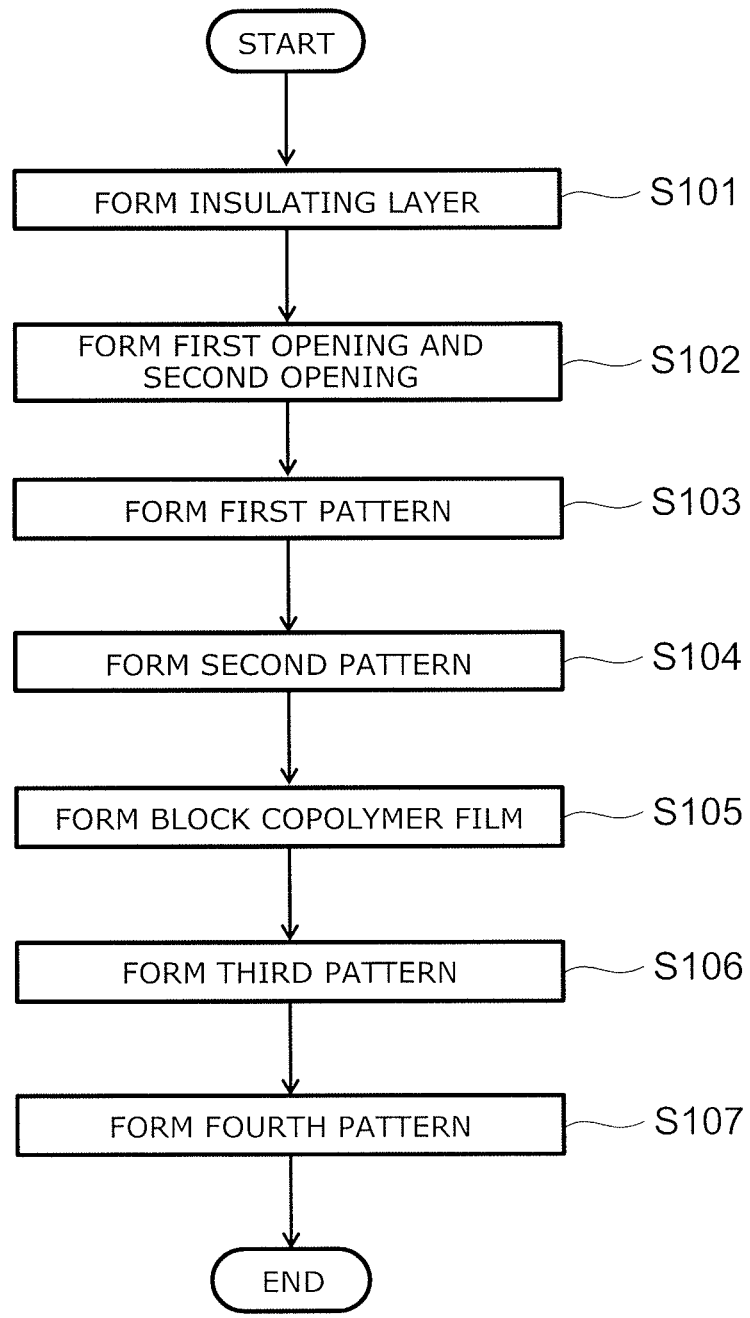
FIG. 1 is a flowchart illustrating a pattern forming method according to a first embodiment.

According to one embodiment, a pattern forming method is disclosed. The method can include forming an insulating layer on a major surface of a substrate. The method can include forming a first opening and a second opening on the insulating layer using a same mold. The first opening has a first length in a first direction along the major surface, and the second opening has a second length longer than the first length in the first direction. The method can include forming a first pattern in the first opening. The method can include forming a second pattern in the second opening. The second pattern is made of a material different from a material for the first pattern and a material for the insulating layer. The method can include forming a self-assembled material film contacting the insulating layer, the first pattern and the second pattern. The method can include forming a third pattern with guidance of the second pattern by causing phase separation of the self-assembled material film. In addition, the method can include forming a fourth pattern contacting the first pattern based on the third pattern.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a flowchart illustrating a pattern forming method according to a first embodiment.

FIGS. 2A to 6B are schematic cross-sectional views illustrating the pattern forming method according to the first embodiment.

Figure 2A:
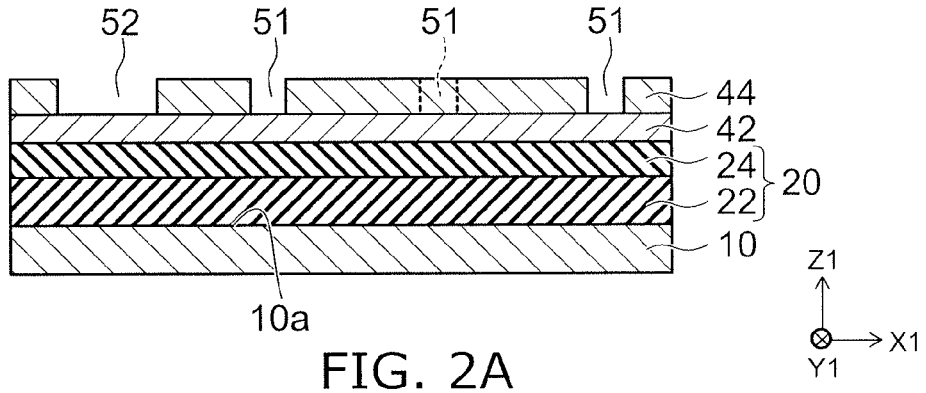
FIGS. 2A to 6B are schematic cross-sectional views illustrating the pattern forming method according to the first embodiment.
Figure 7:
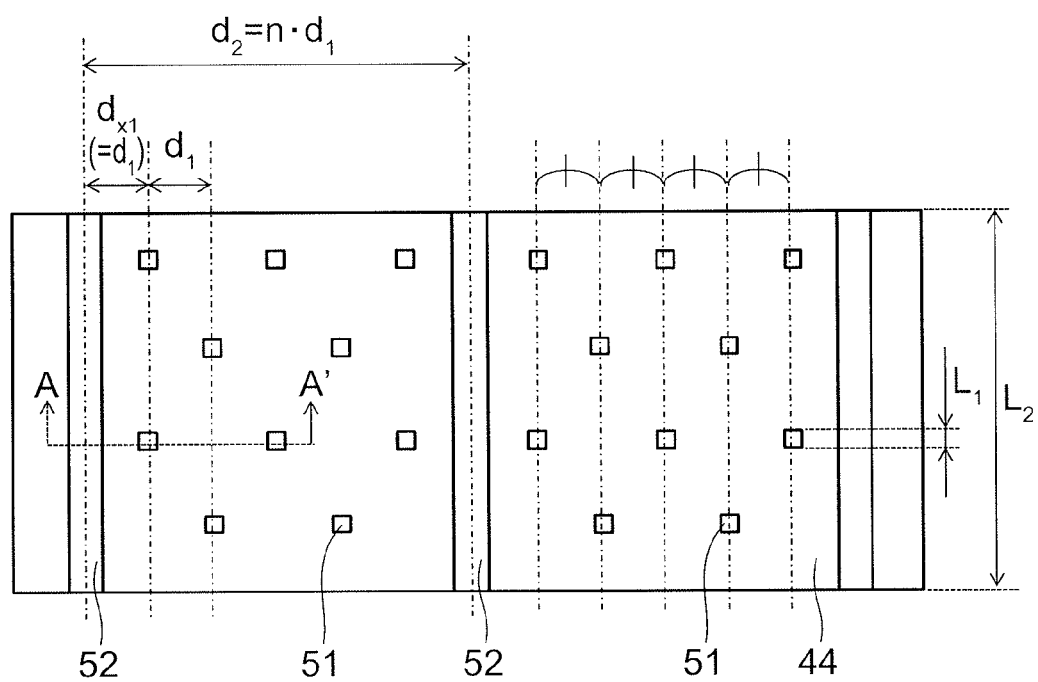
FIG. 7 is a plan view seen from a major surface side in FIG. 2A.

FIG. 7 is a plan view seen from a major surface side in FIG. 2A.

Figure 5A:
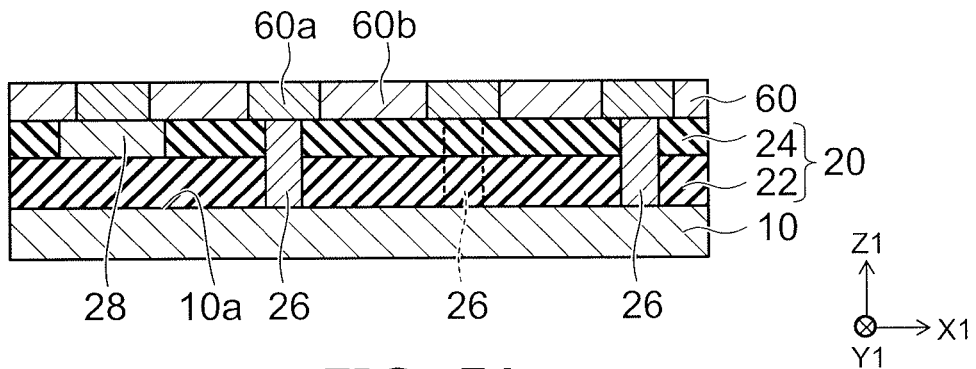
Figure 5B:
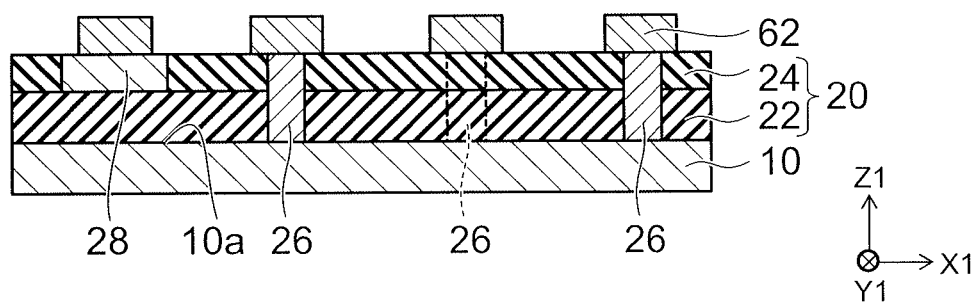
Figure 8:
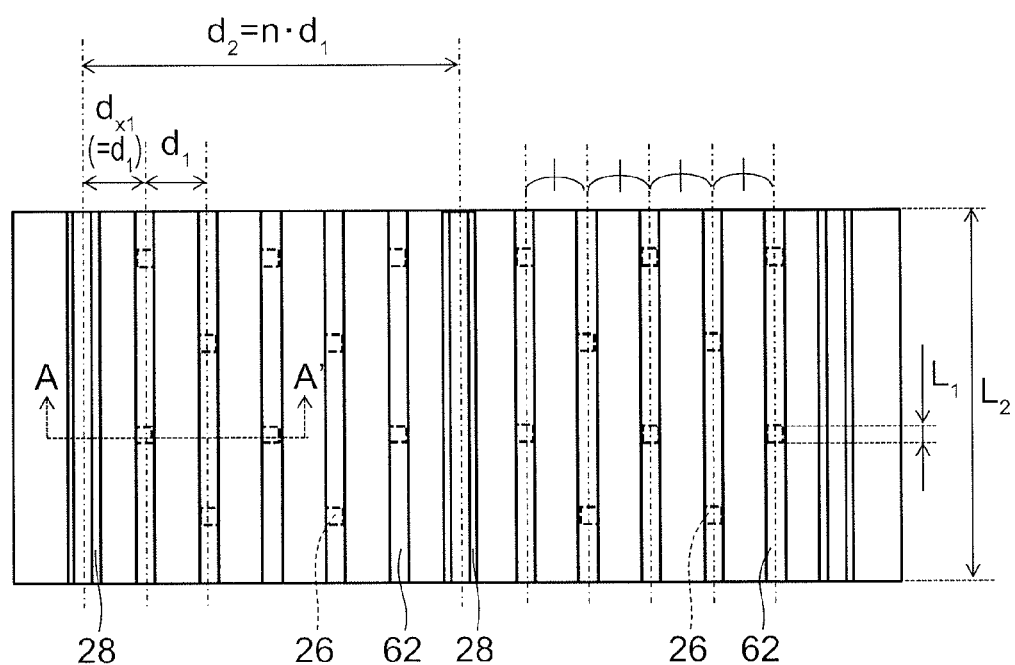
FIG. 8 is a plan view seen from a major surface side in FIG. 5B.

FIG. 8 is a plan view seen from a major surface side in FIG. 5B.

In the following description, refer to FIG. 2A to FIG. 8 for the symbols not represented in FIG. 1.

As shown in FIG. 1, a pattern forming method according to the embodiment includes forming an insulating layer (step S101), forming a first opening and a second opening (step S102), forming a first pattern (step S103), forming a second pattern (step S105), forming a block copolymer film (step S106), forming a third pattern (step S107) and forming a fourth pattern (step S108). In the following, specific examples of each of the steps are described.

First, when forming the insulating layer in step S101, a first insulating layer 22 and a second insulating layer 24 are formed on a major surface 10a of a substrate 10. Note that in the embodiment, the first insulating layer 22 and the second insulating layer 24 are collectively referred to as an insulating layer 20. A material for the first insulating layer 22 differs from a material for the second insulating layer 24. For example, the materials have different etching rates when etched with a predetermined etchant.

Next, when forming the first opening and the second opening in step S102, first openings 51 having a first length in a first direction along the major surface 10a, and second openings 52 having a second length longer than the first length in the first direction are formed in the insulating layer 20 using the same mold 110. In the embodiment, the first openings 51 are formed in the first insulating layer 22 and the second insulating layer 24, and the second openings 52 are formed in the second insulating layer 24.

Next, when forming the first pattern in step S103, a first pattern 26 is formed within the first openings 51. The first pattern 26 is a pattern embedded in the first openings 51. The first pattern 26 is, for example, a contact that pierces the first insulating layer 22 and the second insulating layer 24 to reach the substrate 10.

Next, when forming the second pattern in step S104, a second pattern 28 is formed within the second openings 52. The second pattern 28 is a pattern embedded in the second openings 52. A material for the second pattern 28 differs from a material for the first pattern 26 and a material for the insulating layer 20.

Next, when forming the block copolymer film in step S105, a block copolymer film 60 is formed in contact with the insulating layer 20, the first pattern 26 and the second pattern 28. The block copolymer film is an example of the self-assembled material film.

Next, when forming the third pattern in step S106, the block copolymer film 60 is phase-separated and a third pattern 62 is formed with guidance of the second pattern 28. In other words, the block copolymer film 60 is phase-separated with the second pattern 28 as a guide. In this manner, the third pattern 62 is formed.

Next, when forming the fourth pattern in step S107, a fourth pattern 36 is formed in contact with the first pattern 26 based on the third pattern 62. The fourth pattern 36 is, for example, an interconnection that extends along the major surface 10a and is connected on the first pattern 26 that is, for example, the contact.

The processes represented by the above-described step S101 to step S107 enable to reduce positioning errors of the third pattern 62 in the upper layer with respect to the first pattern 26 in the lower layer.

Next, more detailed specific examples of the pattern forming method according to the first embodiment will be described using FIG. 2 to FIG. 8.

In the descriptions based on FIG. 2A to FIG. 8, a "first direction" refers to a direction (Y1 direction) out of directions along the major surface 10a of the substrate 10. A "second direction" refers to a direction (X1 direction) that is perpendicular to the Y1 direction out of directions along the major surface 10a. A "third direction" refers to a direction (Z1 direction) that is perpendicular to both the first direction and the second direction.

First, as shown in FIG. 2A, the insulating layer is formed (step S101).

In the first embodiment, the first insulating layer 22 and the second insulating layer 24 are formed as the insulating layer 20.

Here, the substrate 10 is, for example, a semiconductor substrate. The semiconductor substrate is made of, for example, silicon. Semiconductor elements, circuits or the like are provided on the substrate 10. Note that the substrate 10 may be an insulating substrate such as a semiconductor substrate other than silicon or a glass substrate, or a substrate that combines an insulating material and a semiconductor material such as SOI (Silicon On Insulator). The substrate 10 has the major surface 10a.

The first insulating layer 22 is formed using, for example, TEOS (Tetraethyl orthosilicate) on the substrate 10. Next, the second insulating layer 24 including a material that differs from that for the first insulating layer 22 is formed on the first insulating layer 22. The second insulating layer 24 includes, for example, silicon nitride (SiN).

Next, the first opening and the second opening are formed (step S102).

As shown in FIG. 2A, an antireflection film 42 is formed on the second insulating layer 24. Next, a photoresist layer 44 is formed on the antireflection film 42. Next, the first openings 51 and the second openings 52 are formed in the photoresist layer 44 using the same mold.

Here, as described above, FIG. 7 is a plan view seen from the major surface side of FIG. 2A.

FIG. 2A corresponds to a cross-section taken along A-A' line in FIG. 7.

The first openings 51 have a first length $L_1$ in the Y1 direction. For example, a plurality of first openings 51 are formed in the photoresist layer 44. The plurality of first openings 51 are provided with an equal interval of distance $d_1$ in the X1 direction.

The second openings 52 extend in the Y1 direction and have a second length $L_2$, which is longer than the first length $L_1$ in the Y1 direction. In the second openings 52, the first length $L_1$ in the Y1 direction is longer than a length in the X1 direction. Specifically, the second openings 52 have, for example, a rectangular shape when viewed in a direction perpendicular to the major surface 10a.

Here, the second openings 52 are formed in positions that do not overlap with the first openings 51 when viewed in the Z1 direction. A distance $d_{X1}$ from the center of the first opening 51 closest to the second opening 52 to the center of the second opening 52 is equal to the interval $d_1$ in the X1 direction between the plurality of first openings 51.

It is sufficient that one or more of the second openings 52 be formed. For example, at least two of the second openings 52 are formed in the photoresist layer 44. The two second openings 52 are formed on both sides of the first opening 51 in the X1 direction. A distance $d_2$ from the center of one of the second openings 52 to the center of the other of the second openings 52 is arranged to be an integer multiple of the interval $d_1$ in the X1 direction between the plurality of first openings 51. In other words, $d_2 = n \cdot d_1$. Here, n is an integer of 1 or greater.

Figure 2B:
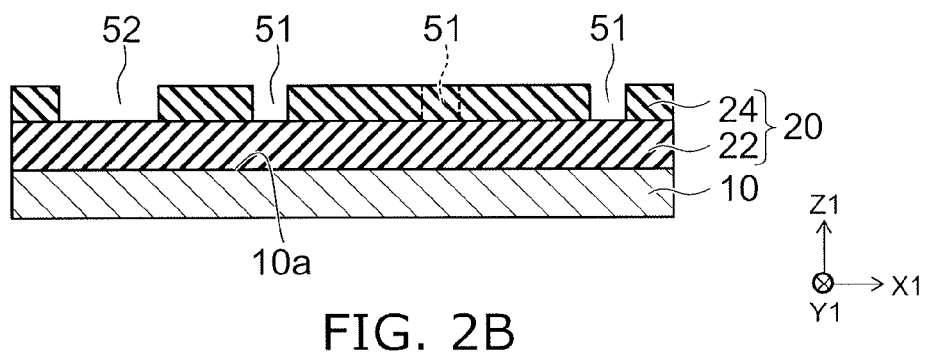

Next, as shown in FIG. 2B, the first openings 51 and the second openings 52 are formed only in the second insulating layer 24 using, for example, a RIE (Reactive Ion Etching) method with the photoresist layer 44 as a mask. For example, etching is performed under a condition that an etching rate in the second insulating layer 24 is faster than the etching rate in the first insulating layer 22. Next, the photoresist layer 44 and the antireflection layer 42 are removed.

Figure 2C:
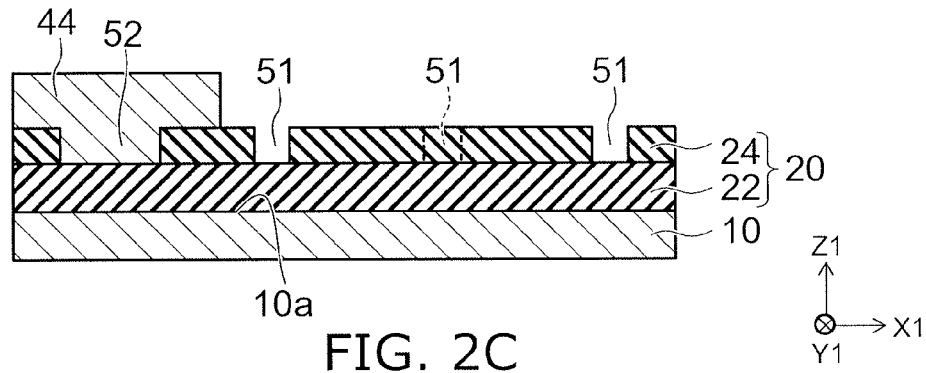

Next, as shown in FIG. 2C, the photoresist layer 44 is formed as a mask layer so as to cover the second openings 52.

Figure 2D:
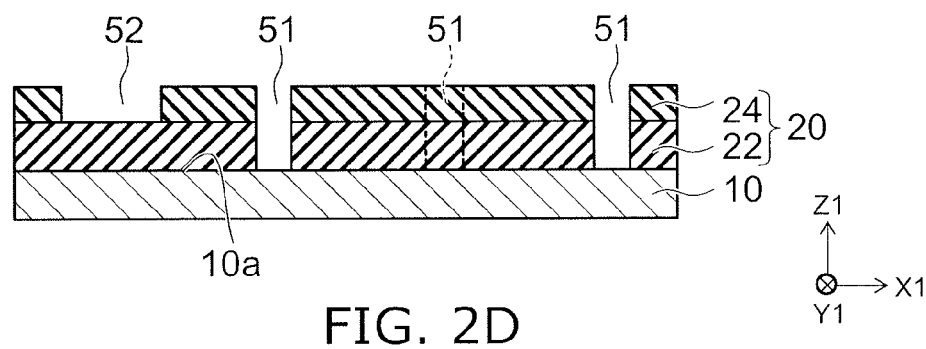

Next, as shown in FIG. 2D, the first openings 51 are pierced to a bottom face of the first insulating layer 22 with the mask layer (photoresist layer 44) and the second insulating layer 24 as a mask. As a result, the first openings 51 that reach the semiconductor element or the like formed on the substrate 10 are formed. Next, the photoresist layer 44 which is the mask layer is removed. As a result, the first openings 51 are formed in the first insulating layer 22 and the second insulating layer 24, and the second openings 52 are formed in the second insulating layer 24.

Figure 3A:
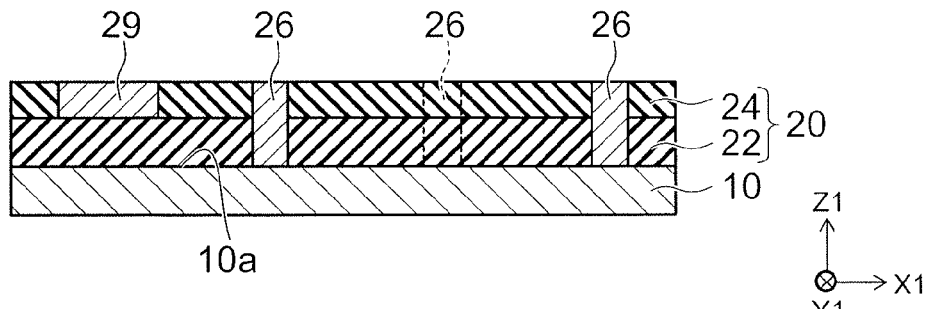

Next, as shown in FIG. 3A, the first pattern is formed (step S103).

In the first embodiment, the first pattern 26 is a contact that includes a conductive material. For example, a first pattern material layer (symbol not shown in drawings) including a conductive material is formed within the first openings 51 and on the second insulating layer 24. Note that the conductive material of the first pattern material layer is, for example, tungsten (W). Alternatively, the first pattern material layer may be formed using a CVD (Chemical Vapor Deposition) method or a plating method.

Next, the top surface of the second insulating layer 24 is flattened by, for example, a CMP (Chemical Mechanical Polishing) method. As a result, the first pattern 26 embedded in the first opening 51 is formed. The first pattern 26 is a contact connected to semiconductor elements or the like formed in the substrate 10. In this process, an embedded portion 29 including a conductive material identical to that for the first pattern 26 is formed in the second opening 52.

Figure 3B:
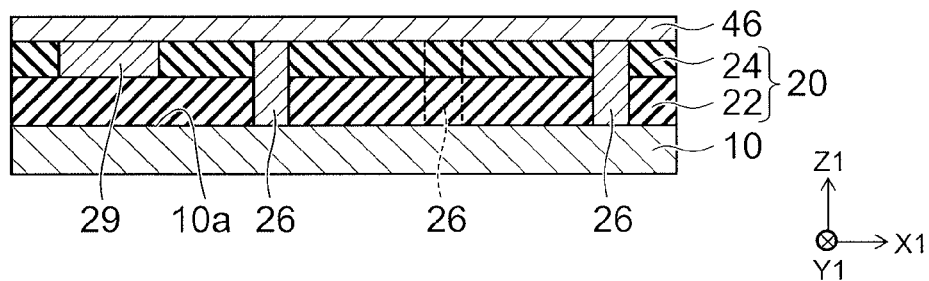

Next, as shown in FIG. 3B, a TEOS layer 46 is formed on the second insulating layer 24, the first pattern 26 and the embedded portion 29.

Figure 3C:
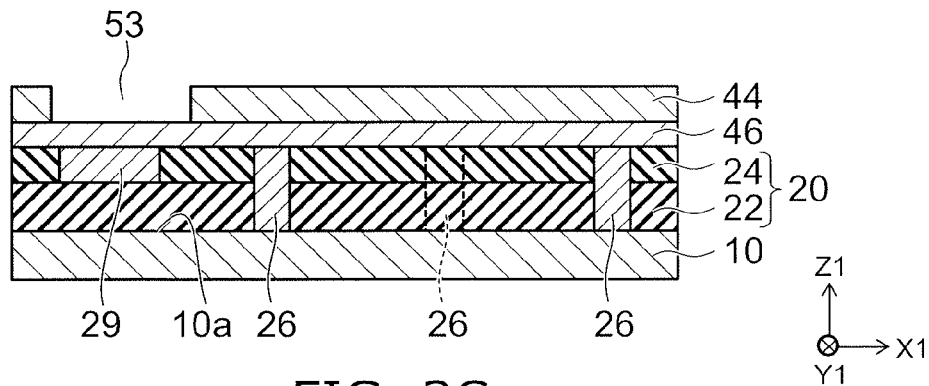

Next, as shown in FIG. 3C, the photoresist layer 44 is formed on the TEOS layer 46. Next, by exposing and developing, third openings 53 are formed at positions corresponding to the embedded portion 29 in the photoresist layer 44. Here, it is desirable that an area of the third openings 53 is greater than an area of the embedded portion 29. As a result, a whole of the embedded portion 29 can be exposed.

Figure 3D:
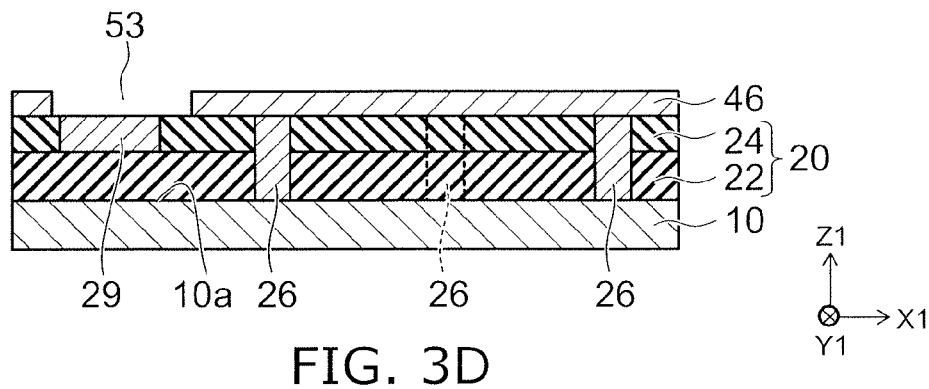

Next, as shown in FIG. 3D, the TEOS layer 46 is etched with the photoresist layer 44 as a mask. Next, the photoresist layer 44 is removed. Thus, the third openings 53 exposing the embedded portion 29 can be formed in the TEOS layer 46.

Figure 4A:
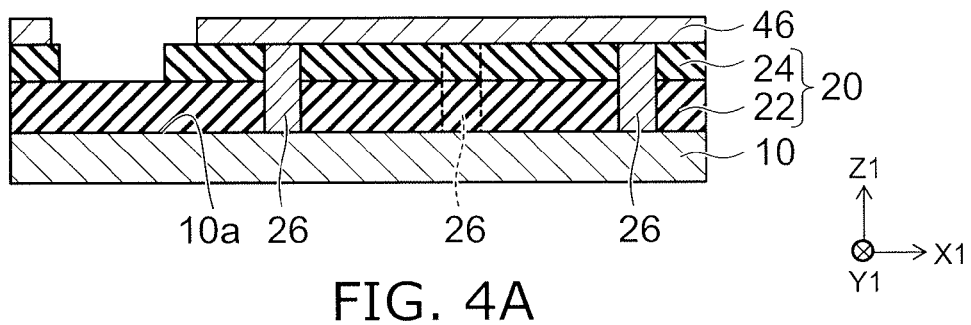

Next, as shown in FIG. 4A, only the embedded portion 29 exposed to the third openings 53 is selectively removed.

Next, as described below, the second pattern is formed (step S104).

Figure 4B:
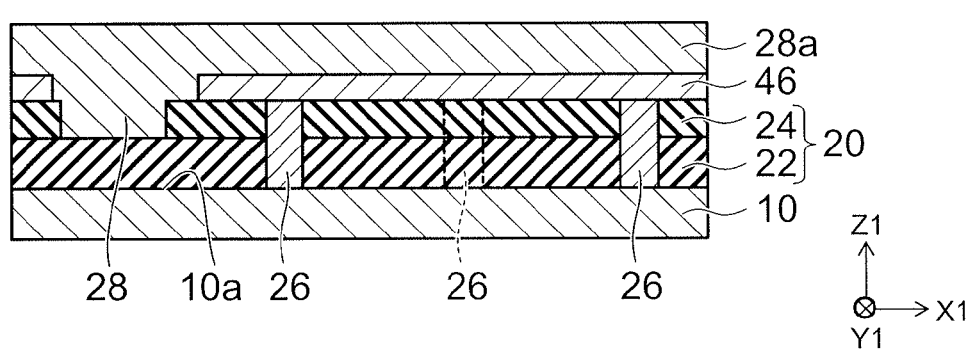

As shown in FIG. 4B, a second pattern material layer 28a is formed in the third openings 53 and on the TEOS layer 46 to form a second pattern 28.

The "second pattern 28" described here functions as a guide for micro-phase separation of a later-described block copolymer film 60. Pattern forming methods using micro-phase separation of the block copolymer film in the manner described are called DSA (Directed Self Assembly). For a guide used in DSA, a so-called "physical guide" that causes phase separation along the construction, a so-called "chemical guide" that causes phase separation as a result of a difference in affinity, or the like may be used. In the first embodiment, the second pattern 28 serving as a guide is preferably a chemical guide.

A material for the second pattern material layer 28a differs from a material for the first pattern 26 and a material for the second insulating layer 24. The material for the second pattern material layer 28a is, for example, an organic film. The material for the second pattern material layer 28a has a functional group that induces micro-phase separation of the later-described block copolymer (BCP) film.

Figure 4C:
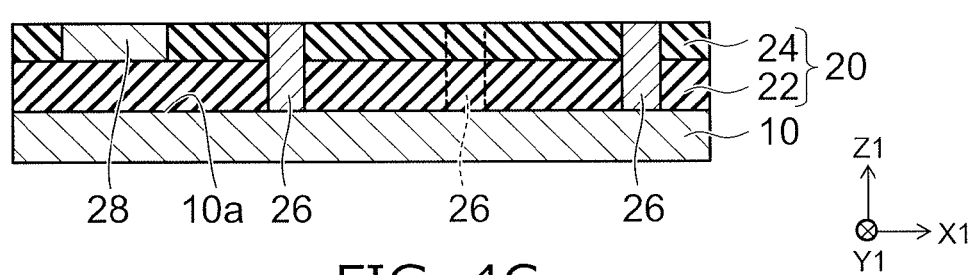

Next, as shown in FIG. 4C, the second pattern material layer 28a is etched back to a height of the surface of the TEOS layer 46. Next, the TEOS layer 46 is removed by CMP to flatten the top surface of the second insulating layer 24 and the top surface of the second pattern 28 to the same level. As a result, the second pattern 28 embedded in the second openings 52 is formed.

Next, the block copolymer film is formed (step S105).

Figure 4D:
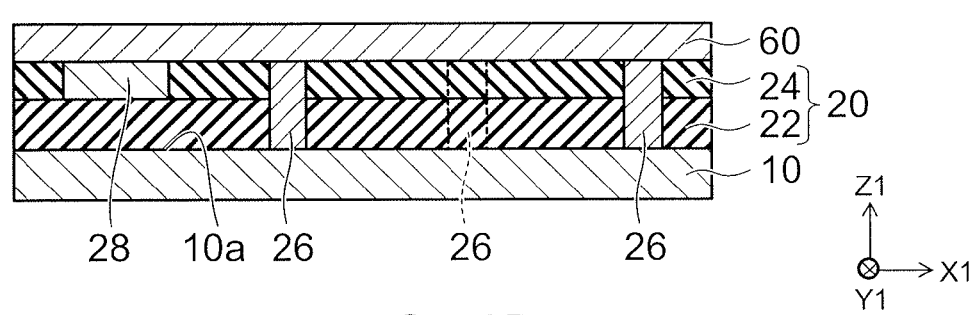

As shown in FIG. 4D, the block copolymer film 60 is formed in contact with the second insulating layer 24, the first pattern 26 and the second pattern 28.

Here, the block copolymer is, for example, a high molecular compound including two chemically bonded polymers. The block copolymer film 60 includes, for example, a first polymer having an affinity for the second pattern 28 and a second polymer having a different affinity to the first polymer for the second pattern 28. For example, the first polymer includes a hydrophilic functional group and the second polymer includes a hydrophobic functional group. Accordingly, with the guidance of the second pattern 28, a lamellar structure including the first polymer and the second polymer can be formed. Further, the interval of the phase separation can be controlled using the composition ratio of the first polymer and the second polymer.

Next, for example, the third pattern is formed (step S104) as follows using DSA.

As shown in FIG. 5A, predetermined processing is performed after the block copolymer film 60 has been uniformly formed. The "predetermined processing" described here is, for example, annealing. As a result, with the guidance of the second pattern 28, the block copolymer film 60 is phase separated into a first region 60a having an affinity for the second pattern 28 and a second region 60b having a different affinity to the first region 60a for the second pattern 28 that is arranged in a region other than the first region 60a.

Next, as shown in FIG. 5B, the block copolymer film 60 is etched to selectively remove the second region 60b under the condition that the etching rate in the second region 60b is faster than the etching rate in the first region 60a. Thus, the third pattern 62 is formed.

FIG. 8 is, as described above, a plan view seen from the major surface side in FIG. 5B.

Note that FIG. 5B corresponds to a cross-section taken along A-A' line in FIG. 8.

As shown in FIG. 8, the third pattern 62 is formed with guidance of the second pattern 28 so as to extend in the Y1 direction.

Further, as shown in FIG. 8, the block copolymer film 60 is phase separated with the interval being substantially equal to the interval $d_1$ between the plurality of first openings 51. Accordingly, the third pattern 62 can be formed so as to contact the first pattern 26.

Note that when forming the third pattern (step S106), the third pattern 62 may be formed by forming and phase separating the block copolymer film 60 simultaneously to cause coagulation of the block copolymer film 60. In other words, in the block copolymer film 60, the third pattern 62 may be formed collectively only in the first region 60a without forming the second region 60b.

Alternatively, when forming the block copolymer film (step S105), the third pattern 62 may be formed by causing phase separation of the block copolymer film so that the third pattern 62 is not formed at the position of the second pattern 28. In this case, the affinity of the block copolymer film 60 is sufficient to be reversed from that of the above-described example.

After forming the block copolymer film (step S105), a portion of the third pattern 62 may be divided using a mold that differs from the mold 110.

Figure 5C:
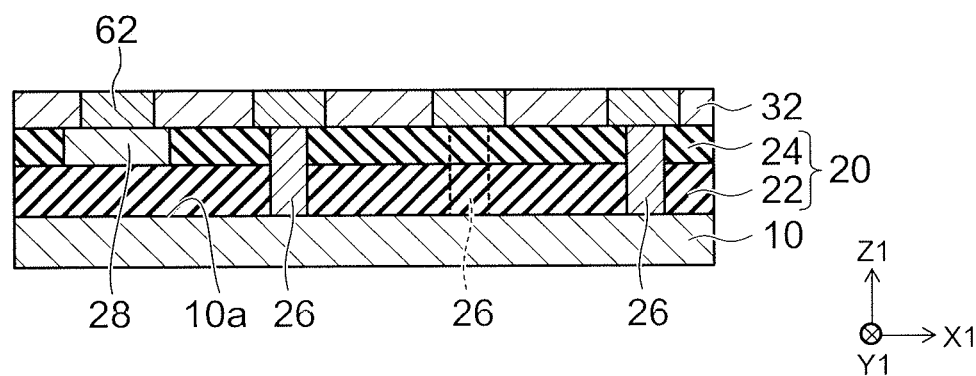

Next, as shown in FIG. 5C, SOG (Spin On Glass) is applied to the second insulating layer 24 and the third pattern 62. Next, a third insulating layer 32 contacting the third pattern 62 is formed on the second insulating layer 24 by performing etchback.

Figure 6A:
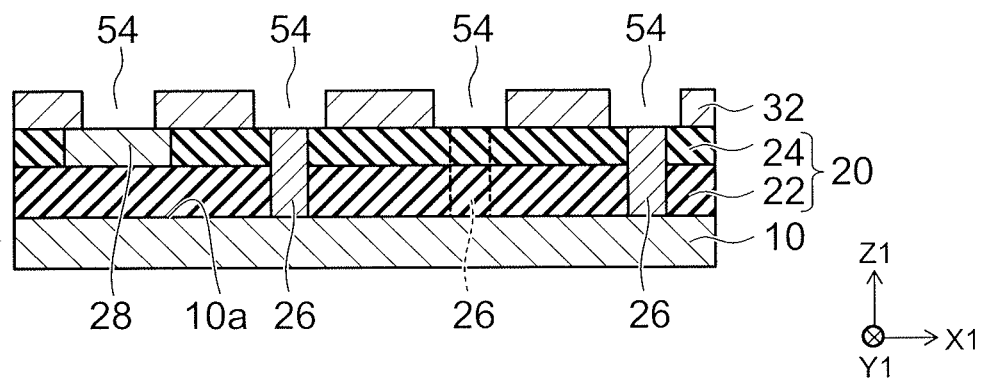

Next, as shown in FIG. 6A, the third pattern 62 is selectively removed. Accordingly, fourth openings 54 are formed at the position of the third pattern 62.

Next, the fourth pattern is formed (step S107).

In the first embodiment, the fourth pattern 36 is, for example, an interconnection including a conductive material.

Figure 6B:
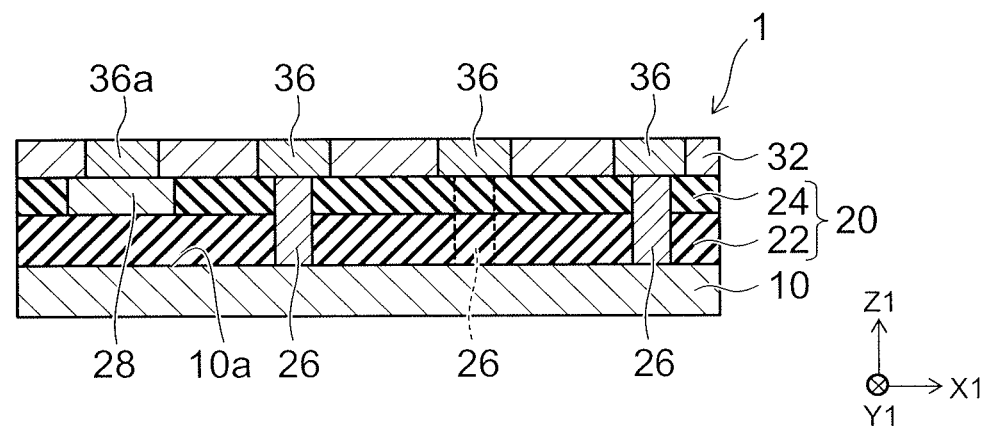

As shown in FIG. 6B, a fourth pattern material layer (symbol not shown in drawings) including a conductive material is formed in the fourth openings 54 and on the third insulating layer 32 by, for example, sputtering. The conductive material of the fourth pattern material layer is, for example, tungsten (W). Next, the top surface of the third insulating layer 32 is flattened using a CMP method. Thus, the fourth pattern 36 contacting the first pattern 26 is formed based on the third pattern 62. At this time, an interconnection 36a (e.g., dummy pattern) may be formed on the second pattern 28 using the same material as that for the fourth pattern 36.

Next, the effects of the first embodiment will be described.

Here, as a reference example, a case will be described in which a mold different from the mold used when forming the first pattern 26 is used to form a guide pattern to guide phase separation of the block copolymer film on the first pattern. In the reference example, the first pattern is first formed on an insulating layer using the first mold. Next, the guide pattern is formed on the first pattern using a second mold that differs from the first pattern. In this process, when the guide pattern is positioned to the first pattern, there is a possibility that a positioning error $\sigma_{litho}$ of the guide pattern with respect to the first pattern is generated.

Next, a block copolymer film is formed on the insulating film and the guide pattern. Next, with guidance of the guide pattern, the block copolymer film is phase-separated to form the third pattern. Since there is a possibility that the shift in the position of the phase-separation of the block copolymer film with respect to the guide pattern may occur within a certain range, there is a possibility that a positioning error $\sigma_{DSA}$ of the third pattern with respect to the guide pattern will occur.

Accordingly, in the method of the reference example, a total positioning error $\sigma_{total}$ of the third pattern with respect to the first pattern is given by formula (1) below.

$$\sigma_{total} = (\sigma_{litho}^2 + \sigma_{DSA}^2)^{1/2} \quad (1)$$

By contrast, according to the first embodiment, the first pattern 26 targeted for positioning and the second pattern 28 for guiding the phase separation of the block copolymer film 60 are formed in the same insulating layer (second insulating layer 24) using the same mold 110. Next, the block copolymer film 60 is formed on the insulating layer. Next, the third pattern 62 is formed by causing phase separation of the block copolymer film 60 with guidance of the second pattern 28.

In the first embodiment, the same mold 110 is used to form the first pattern 26 and the second pattern 28. As a result, in the first embodiment, positioning errors of the second pattern 28 with respect to the first pattern 26 are not generated. Hence, in the first embodiment, a positioning error $\sigma_{total}$ of the third pattern 62 with respect to the first pattern 26 is an amount of shift in the phase separation of the block copolymer film, in other words, only the positioning error $\sigma_{DSA}$ of the third pattern 62 with respect to the second pattern 28. Thus, the positioning error of the third pattern 62 in the upper layer with respect to the first pattern 26 in the lower layer can be reduced.

Second Embodiment

Figure 9:
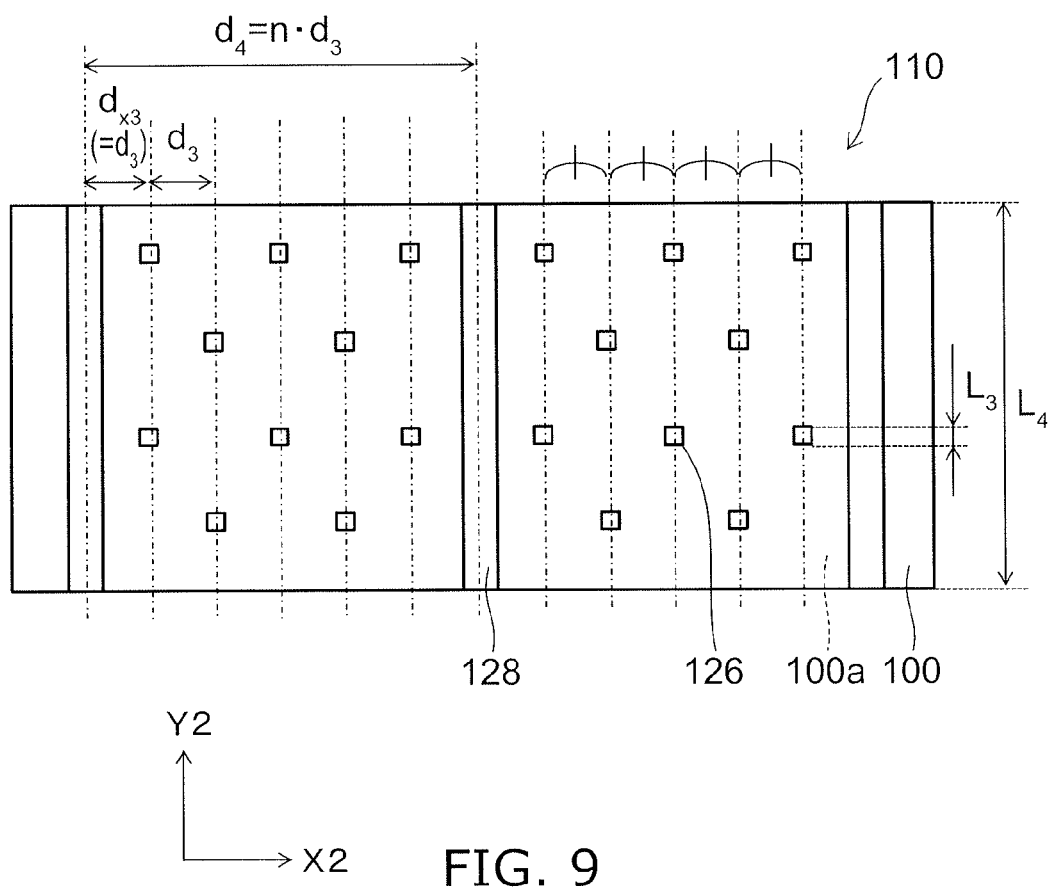
FIG. 9 and FIG. 10 are schematic views illustrating a mold according to a second embodiment.
Figure 10:
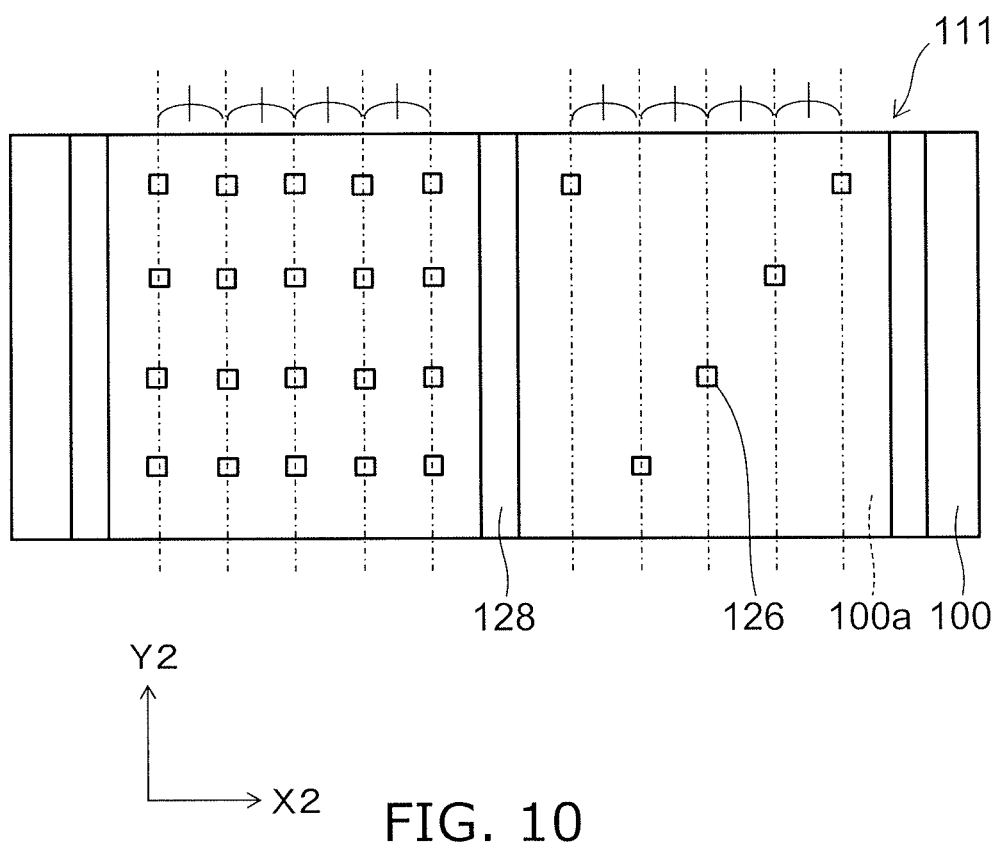

FIG. 9 and FIG. 10 are schematic views illustrating a mold according to a second embodiment.

FIG. 9 and FIG. 10 show schematic plan views of a mold 110.

In FIG. 9 and FIG. 10, a "first direction" refers to a direction (Y2 direction) out of directions along a major surface 100a of a support substrate 100. Further, a "second direction" refers to a direction (X2 direction) perpendicular to the Y2 direction out of directions along the major surface 100a.

The mold 110 according to the second embodiment is used to form first openings 51 and second openings 52 that are longer than the first openings 51 in the same insulating layer 20 in, for example, the forming first openings and second openings (step S102) in the first embodiment (step S102). As described above, a first pattern 26 is, for example, formed in the first openings 51. Also, a second pattern 28 is formed in the second openings 52, and the second pattern 28 functions as a guide when phase-separating a block copolymer film 60 positioned in an upper layer of the first pattern 26.

The mold 110 according to the second embodiment includes the support substrate 100, a first mold pattern 126 and a second mold pattern 128.

The mold 110 is, for example, a photomask for exposing a photoresist.

The support substrate 100 is made of, for example, quartz glass. The support substrate 100 has the major surface 100a. The major surface 100a refers to a surface on a side where a pattern has been formed using a light shielding film (symbol not shown in drawings). On the support substrate 100, the first mold pattern 126 and the second mold pattern 128 are provided using, for example, the light shielding film. Note that the first mold pattern 126 and the second mold pattern 128 may be provided as opening portions in the light shielding film.

The first mold pattern 126 is a pattern for forming the first openings 51. The first mold pattern 126 has a first length $L_3$ in the Y2 direction. When the mold 110 is a mask for actual-size exposure, the first length $L_3$ of the first mold pattern 126 is equal to the first length $L_1$ of the first openings 51. In other words, $L_3 = L_1$. Here, when the mold 110 is a mask for reduction exposure, the lengths in the mold 110 only need to be the lengths obtained by multiplication with the reciprocal of the magnification for the reduction exposure. In the following, the case in which the mold 110 is a mask for actual-size exposure is described.

In FIG. 9, the first mold pattern 126 is, for example, provided in a rectangular island shape. Corner portions of the first mold pattern 126 may be slightly rounded. The first mold pattern 126 may also, for example, be circular.

As shown in FIG. 9, the mold 110 is, for example, provided with a plurality of first mold patterns 126. The plurality of first mold patterns 126 are provided with an equal interval of distance $d_3$ in the X2 direction. The plurality of first mold patterns 126 is, for example, provided in a staggered form. Note that $d_3$ of the plurality of first mold patterns 126 is equal to the interval $d_1$ between the plurality of first openings 51. In other words, $d_3 = d_1$.

The second mold pattern 128 is a pattern for forming the second openings. The second mold pattern 128 extends in the first direction and has a second length $L_4$ that is longer than the first length $L_3$ in the Y2 direction. In the second mold pattern 128, the second length $L_4$ in the Y2 direction is longer than the length in the X2 direction. Specifically, the second mold pattern 128 is, for example, rectangular in a planar view. Corner portions of the second mold pattern 128 may be slightly rounded.

The second mold pattern 128 is disposed at a position separated from the first mold pattern 126. A distance $d_{X3}$ from the center of the first mold pattern 126 closest to the second mold pattern 128 to the center of the second mold pattern 128 is, for example, equal to the interval $d_3$ in the X2 direction between the plurality of first mold patterns 126.

Alternatively, for example, at least two of the second mold patterns 128 are provided. The two second mold patterns 128 are provided on both sides in the X2 direction. The distance $d_4$ from the center of one second mold pattern 128 to the other second mold pattern 128 is an integer multiple of the interval $d_3$ in the X2 direction between the plurality of first mold patterns 126. In other words, $d_4 = n \cdot d_3$. Here, n is an integer of 1 or more.

The first pattern 26 and the second pattern 28 are formed without being misaligned with respect to each other by forming the first openings 51 and the second openings 52 through exposure using the mold 110 of the second embodiment. Here, the positioning error that occurs, as described as the Reference Example in the first embodiment, when the first pattern 26 and the second pattern 28 are formed by separate exposures with different molds does not occur. By making the second pattern function as a guide that causes phase separation of the block copolymer film, a third pattern contacting the first pattern can be formed at the desired position.

In the second embodiment above, the case where the mold 110 is a photomask is described. However, when a pattern such as resin or the like is formed using a transfer method, the mold 110 may be a template having a protrusion pattern and a recess pattern for transferring the pattern.

FIG. 10 shows a mold 111 that is a variation of the second embodiment.

As shown on the left side of FIG. 10, the plurality of first mold patterns 126 may be disposed in a square matrix form.

Further, as shown on the right side of FIG. 10, the plurality of first mold patterns 126 may be provided with an unequal interval in the Y2 direction. Thus, it is sufficient that the plurality of first mold patterns 126 are provided with an equal interval of distance $d_1$ at least in the X2 direction.

Third Embodiment

Figure 11:
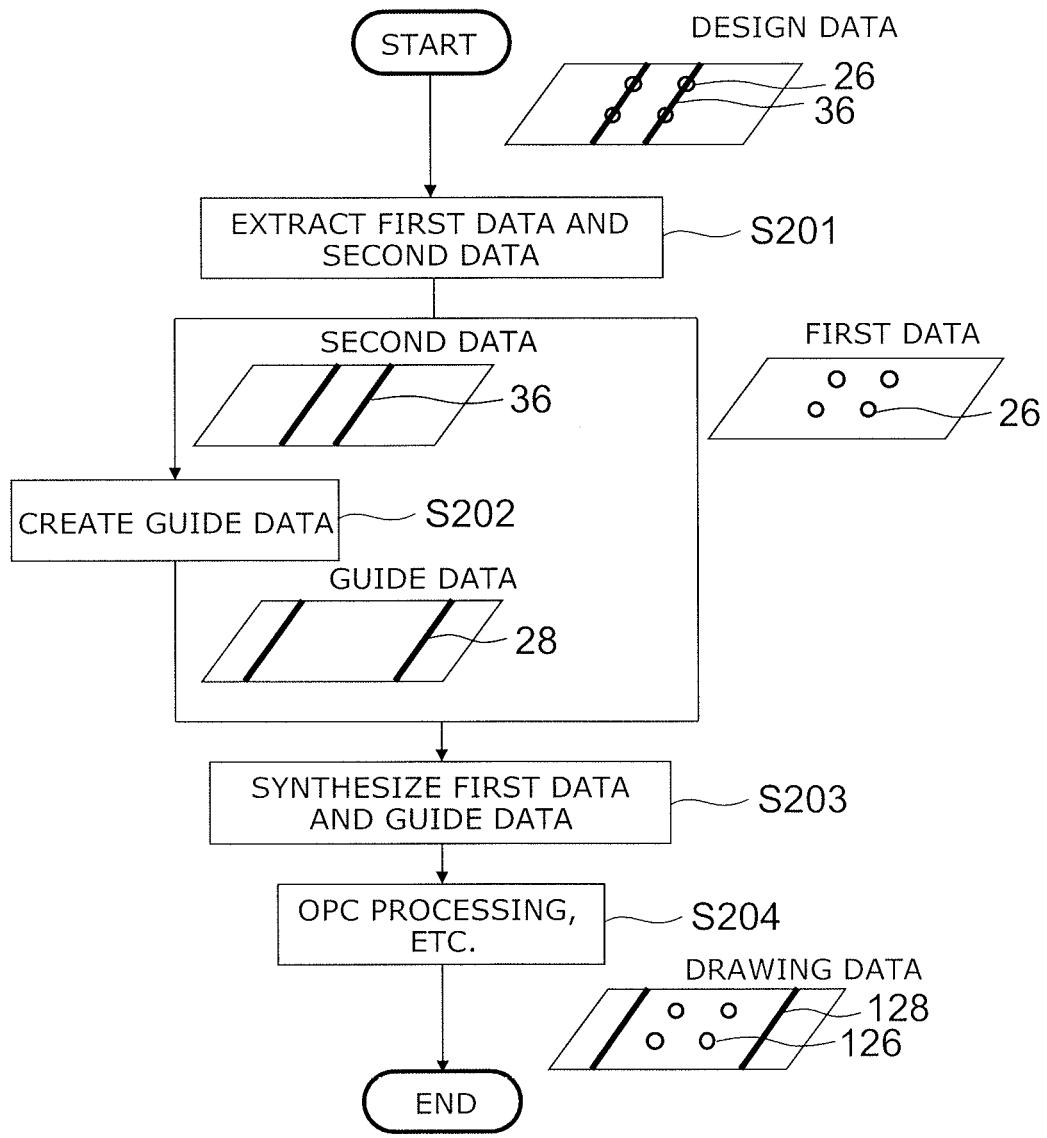
FIG. 11 is a flowchart illustrating a data processing method according to a third embodiment.

FIG. 11 is a flowchart illustrating a data processing method according to a third embodiment.

Here, the data processing method according to the third embodiment includes the processing of step S201, step S202 and step S203 shown in FIG. 11. In FIG. 10, other processing for a specific example is also shown. The illustrations appended to the side of flowchart are schematic views illustrating design data and drawing data. In the following, a "pattern" refers to a pattern formed on the actual semiconductor device or the like, and "data" refers to design data or drawing data for forming a pattern.

The data processing method according to the third embodiment is a method for the creating drawing data for forming the mold 110 from design data.

As shown in FIG. 11, the data processing method according to the third embodiment includes extracting first data and second data (step S201), creating guide data (step S202) and synthesizing the first data together with the guide data (step S203).

When extracting the first data and the second data in step S201, the first data for forming a first pattern (hereinafter referred to as a first pattern 26) having a first length $L_1$ in a first direction, and the second data for forming a second pattern (hereinafter referred to as a fourth pattern 36) that overlaps with the first pattern 26 and has a second length $L_2$ longer than the first length $L_1$ are extracted from the design data, respectively.

When creating the guide data in step S202, the guide data is created for forming a guide pattern (hereinafter referred to as a second pattern 28) extending in a first direction at a position separated from the first pattern 26 and the fourth pattern 36.

When synthesizing the first data together with the guide data in step S203, the first data and the guide data are synthesized to create the drawing data.

Next, specific examples of the data processing method according to the third embodiment will be described. Note that in the specific examples described below, steps other than the above-described step S201, step S202 and step S203 are also included.

As shown in FIG. 11, the design data is first prepared. The design data is, for example, data created using CAD (Computer Aided Design). The design data includes, as described above, the first data for forming the first pattern 26 and the second data for forming the fourth pattern 36 that overlaps with the first pattern 26. Note that at this stage, the first data and the second data may be created as a single set of data.

For example, the first pattern 26 is a contact on a semiconductor device. The fourth pattern 36 is an interconnection that is connected to the first pattern 26 and is a pattern formed using DSA. The plurality of fourth patterns 36 are provided with an equal interval of a predetermined distance $d_1$.

Next, the first data and the second data are extracted (step S201).

The first data and the second data are extracted separately from the design data. Here, "extract separately" is used to mean, for example, the division of the first data and the second data into different layers in the CAD software. Here, "layer" refers to a level of data.

Next, the guide data is created (step S202).

The guide data for forming the guide pattern is created. The second pattern 28 that is the guide pattern extends parallel to the fourth pattern 36 in the first direction at a position separated from the first pattern 26 and the fourth pattern 36. Here, the guide data is created in a different layer from the first data and the second data.

For example, a distance from the center of the fourth pattern 36 to the center of the second pattern 28 is equal to the interval $d_1$ between the plurality of fourth patterns 36. Further, it is favorable that the position of the second pattern 28 does not interfere with the position of the other patterns.

Next, the first data and the guide data are synthesized (step S203).

For example, the first data and the guide data which have been processed as different layers are synthesized to create a single set of drawing data.

Next, OPC processing or the like is performed as required (step S204).

Here, OPC refers to optical proximity correction.

By using the mold 110 formed by the data processing method according to the embodiment, the positioning error when forming the fourth pattern 36 in the upper layer with respect to the first pattern 26 in the lower layer can be reduced.

Fourth Embodiment

Figure 12:
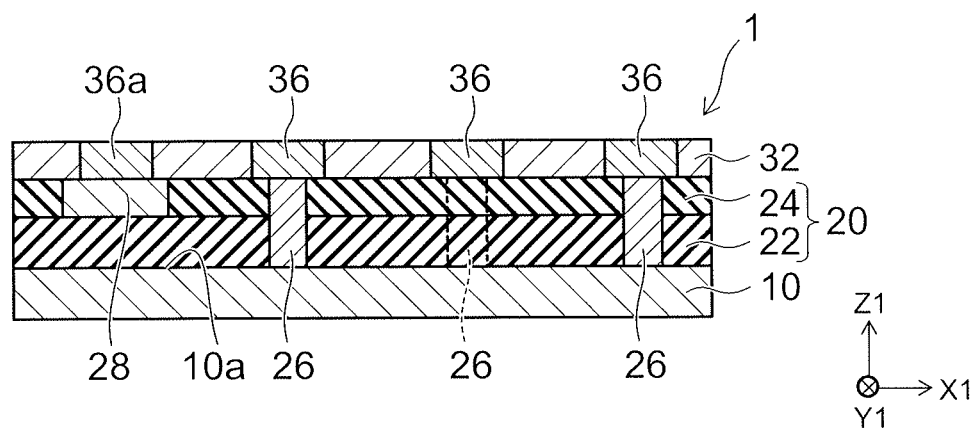
FIG. 12 is a schematic view illustrating a semiconductor device according to a fourth embodiment.

FIG. 12 is a schematic view illustrating a semiconductor device according to a fourth embodiment.

The semiconductor device 1 according to the fourth embodiment is manufactured using the pattern forming method of the first embodiment.

The semiconductor device 1 according to the fourth embodiment includes a substrate 10, a first insulating layer 22, a second insulating layer 24, a contact (hereinafter referred to as a first pattern 26), a guide portion (hereinafter referred to as a second pattern 28) and an interconnection (hereinafter referred to as a fourth pattern 36).

The substrate 10 includes a major surface 10a. The major surface 10a is a face on a side where the first insulating layer 22 and the second insulating layer 24 are laminated. Semiconductor elements, circuits or the like are provided on the substrate 10.

The first insulating layer 22 is provided on the substrate 10. The first insulating layer 22 is, for example, formed from TEOS. The second insulating layer 24 is provided on the first insulating layer 22. The second insulating layer 24 includes a material that differs from that for the first insulating layer 22. The second insulating layer 24 includes, for example, SiN.

The first pattern 26 that is a contact is provided on the first insulating layer 22 and the second insulating layer 24. The first pattern 26 contacts the substrate 10 and is connected to the semiconductor elements or the like. Further, the first pattern 26 has a first length $L_1$ in the Y1 direction along the major surface 10a.

The second pattern 28 that is the guide portion is provided in the same layer as the second insulating layer 24. The second pattern 28 is disposed at a position separated from the first pattern 26. The second pattern 28 extends in the above-described first direction and has a second length $L_2$ longer than the first length $L_1$ in the Y1 direction. The second pattern 28 also includes a material that differs from the materials for the second insulating layer 24 and the first pattern 26.

As described in the first embodiment, the second pattern 28 functions as a guide portion to be used in DSA.

Here, the top surface of the second insulating layer 24, the top surface of the first pattern 26 and the top surface of the second pattern 28 have been flattened. In other words, the top surface of the second insulating layer 24, the top surface of the first pattern 26 and the top surface of the second pattern 28 form the same plane.

The fourth pattern 36 is provided on the second insulating layer 24. The fourth pattern 36 is provided extending in the first direction. The fourth pattern 36 contacts the first pattern 26. The fourth pattern 36 is substantially parallel to the second pattern 28 when viewed in the Z1 direction.

On the second pattern 28, an interconnection 36a including the same material as the fourth pattern 36 is provided by phase separation of the block copolymer film of the first embodiment. For example, the interconnection 36a is provided in parallel with the fourth pattern 36 but not connected to the fourth pattern 36.

The third insulating layer 32 is provided on the second insulating layer 24. The third insulating layer 32 contacts at least a side surface of the fourth pattern 36.

Note that a multi-layer interconnection layer may be provided on the third insulating layer 32. Also, an interconnection layer including the first pattern 26 and the second pattern 28 may be formed in a part of an interconnection layer that forms the multi-layer interconnection layer.

When the semiconductor device 1 is formed by the pattern forming method according to the first embodiment as in the fourth embodiment, the second pattern 28 to guide phase-separation of the block copolymer film may remain in the same layer as the first pattern 26 in a part of an interconnection layer that forms the semiconductor device 1. Providing the second pattern 28 enables the semiconductor device 1 to be provided with improved positioning accuracy of the fourth pattern 36 in the upper layer with respect to the first pattern 26 in the lower layer.

Fifth Embodiment

Figure 13:
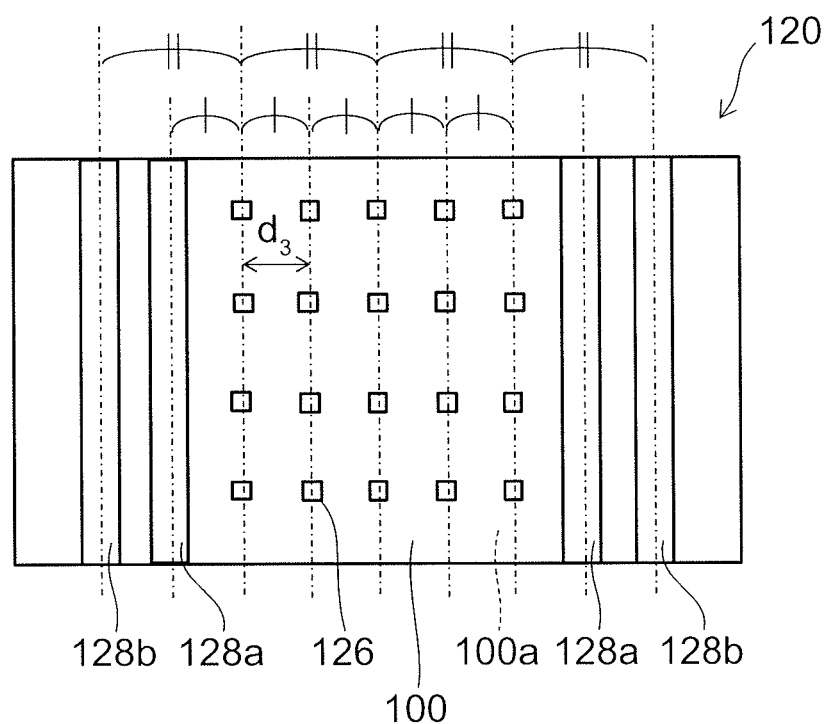
FIG. 13 is a schematic view illustrating a mold according to a fifth embodiment.

FIG. 13 is a schematic view illustrating a mold according to a fifth embodiment.

A mold 120 according to the fifth embodiment is the same as that of the first embodiment except in that a plurality of second mold patterns is provided in order to form different interconnection layers.

As shown in FIG. 13, the mold 120 according to the fifth embodiment is provided with a plurality of second mold patterns for forming the second openings 28 in each of a plurality of second insulating layers 24. For example, two sets of a second mold pattern 128a and a second mold pattern 128b are provided at positions opposing each other across the first mold pattern 126.

The second mold pattern 128a is, for example, provided at a position that is separated by exactly an interval $d_3$ in the X1 direction from the first mold pattern 126.

On the other hand, the second mold pattern 128b is provided at a position that is separated by exactly an integer multiple of the interval $d_1$ in the X1 direction from the first mold pattern 126. In this case, the second mold pattern 128b is provided at a position that is separated by exactly an interval $2d_1$ from the first mold pattern 126.

Next, the effects of the fifth embodiment will be described.

Here, a case will be described where a different mold for each of N insulating layers is used to form a guide pattern that guides phase separation of the block copolymer film. In this case, when the positioning errors for forming the guide pattern for each layer are taken to be $\sigma_1 \ldots \sigma_N$, and the positioning error due to DSA is taken to be $\sigma_{DSA}$, a total positioning error $\sigma_{total}$ of a pattern in the N-th layer with respect to a pattern in the first layer is given by Formula (2) below.

$$\sigma_{total} = (\sigma_1^2 + \sigma_2^2 + \ldots + \sigma_N^2 + N \cdot \sigma_{DSA}^2)^{1/2} \quad (2)$$

By contrast, according to the fifth embodiment, the guide pattern (a second pattern 28y and a sixth pattern 78y) that guides the phase separation of the block copolymer film can be formed using the same mold in each of the N insulating layers. Thus, in the fifth embodiment, the total positioning error $\sigma_{total}$ of the pattern in the N-th layer with respect to the pattern in the first layer is simply the integrated value of the positioning errors due to DSA $(N \cdot \sigma_{DSA}^2)^{1/2}$. Thus, the positioning accuracy over the plurality of layers can be improved.

As described above, according to the embodiments, a pattern forming method, a mold and a data processing method that can improve the positioning accuracy can be provided.

Although the embodiment and modifications thereof are described above, the invention is not limited to these examples. For example, additions, deletions, or design modifications of components or appropriate combinations of the features of the embodiments appropriately made by one skilled in the art in regard to the embodiments or the modifications thereof described above are within the scope of the invention to the extent that the purport of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A pattern forming method comprising:
    forming an insulating layer on a major surface of a substrate;
    forming a first opening and a second opening on the insulating layer using a same mold, the first opening having a first length in a first direction along the major surface, the second opening having a second length longer than the first length in the first direction;
    forming a first pattern in the first opening;
    forming a second pattern in the second opening, the second pattern being made of a material different from a material for the first pattern and a material for the insulating layer;
    forming a self-assembled material film contacting the insulating layer, the first pattern and the second pattern;
    forming a third pattern with guidance of the second pattern by causing phase separation of the self-assembled material film; and
    forming a fourth pattern contacting the first pattern based on the third pattern.

2. The method according to claim 1, wherein the forming the third pattern includes forming the third pattern extending in the first direction.

3. The method according to claim 1, wherein
the forming the insulating layer includes
forming a first insulating layer on the substrate, and
forming a second insulating layer on the first insulating layer, the second insulating layer being made of a material different from a material for the first insulating layer, and
the forming the first opening and the second opening includes
forming the first opening in the first insulating layer and the second insulating layer, and
forming the second opening in the second insulating layer.

4. The method according to claim 1, wherein
the forming the first opening and the second opening includes
forming the first opening and the second opening in the second insulating layer,
forming a mask layer covering the second opening, and
piercing the first opening to a bottom face of the first insulating layer with the mask layer and the second insulating layer as a mask.

5. The method according to claim 1, wherein
the first pattern is a contact including a conductive material, and
the fourth pattern is an interconnection including a conductive material.

6. The method according to claim 1, wherein
the first opening is provided in a plurality in a second direction perpendicular to the first direction along the major surface,
the second opening is provided in a plurality in the second direction, and
an interval in the second direction between the plurality of second openings is an integer multiple of an interval in the second direction between the plurality of first openings.

7. The method according to claim 1, wherein the second pattern is a chemical guide when the self-assembled material film undergoes micro-phase separation.

8. The method according to claim 1, wherein the self-assembled material film includes a first polymer having an affinity for the second pattern and a second polymer having a different affinity to the first polymer for the second pattern.

9. The method according to claim 8, wherein the first polymer has a hydrophilic functional group, and
the second polymer has a hydrophobic functional group.

10. The method according to claim 1, wherein the forming the third pattern includes causing phase separation of the self-assembled material film by heating.

11. The method according to claim 1, wherein the forming the second pattern includes flattening a top surface of a material for the second pattern so that the top surface of the material is in a same plane as a top surface of the insulating layer after embedding the material for the second pattern in the second opening.

12. The method according to claim 1, wherein the forming the self-assembled material film includes forming the self-assembled material film on a flattened face of the insulating layer and the second pattern.

* * * * *